United States Patent [19]

Mowery

[11] Patent Number: 5,045,801

[45] Date of Patent: Sep. 3, 1991

[54] METASTABLE TOLERANT ASYNCHRONOUS INTERFACE

[75] Inventor: David L. Mowery, Highland, Md.

[73] Assignee: The United States of America as represented by the Secretary of the Air Force, Washington, D.C.

[21] Appl. No.: 530,706

[22] Filed: May 29, 1990

[51] Int. Cl.$^5$ .................. H03K 17/16; H03K 5/156
[52] U.S. Cl. .................................. 328/72; 328/74;
307/269; 307/271; 307/475; 375/108;
364/239.1
[58] Field of Search .................. 328/72, 71, 74, 75;
372/28; 375/108; 307/269, 271, 272.2, 272.3,
475; 364/239.1

[56] References Cited

U.S. PATENT DOCUMENTS

| | | | |
|---|---|---|---|
| 4,289,979 | 9/1981 | Muller | 303/272.2 |
| 4,349,754 | 9/1982 | Bull | 328/74 |
| 4,495,628 | 1/1985 | Zasio | 377/70 |
| 4,544,850 | 10/1985 | Tarleton | 328/72 |
| 4,575,860 | 3/1986 | Scordo | 328/74 |
| 4,698,830 | 10/1987 | Barzilai et al. | 377/19 |
| 4,780,895 | 10/1988 | Paul | 377/39 |
| 4,797,572 | 1/1989 | Metz | 307/269 |
| 4,819,251 | 4/1989 | Nelson | 328/74 |
| 4,855,616 | 8/1989 | Wang et al. | 307/269 |

Primary Examiner—John S. Heyman
Attorney, Agent, or Firm—Bernard E. Franz; Donald J. Singer

[57] ABSTRACT

The interface circuit passes data from a first unit running at one clock rate to a second unit running at another clock rate. READY leads from an In control circuuit to an Out control circuit are used to signal when a data word has been loaded by the first unit; and TAKEN leads from the Out control circuit to the In control circuit are used to signal when a data word has been received by the second unit. An anti-Metastable Flip-flop (AMF) is used with each READY lead and each TAKEN lead. Each AMF flip-flop comprises an input latch, an output latch, a decentration driver, and an oscillation suppressor. The decentration driver handles cases in which the output of the input latch is balanced and floating or balanced and driven by tugging the output of the input latch toward a logic 0 soon after an active edge of a signal on the flip-flop clock lead has caused the input latch to close. The oscillation suppressor is coupled between the input latch and the output latch for eliminating oscillation by delaying output signals from the input latch by various times and anding the differently delayed signals together. Thus the interface circuit supresses the effects of metastable states by forcing the flip-flop output to a reliable logic 0 or 1 when it is in a metastable state. The circuit disclosed herein is unique in that it suppresses states in asynchronous interfaces without inserting additional flip-flop delays, or requiring retransmission of data.

4 Claims, 2 Drawing Sheets

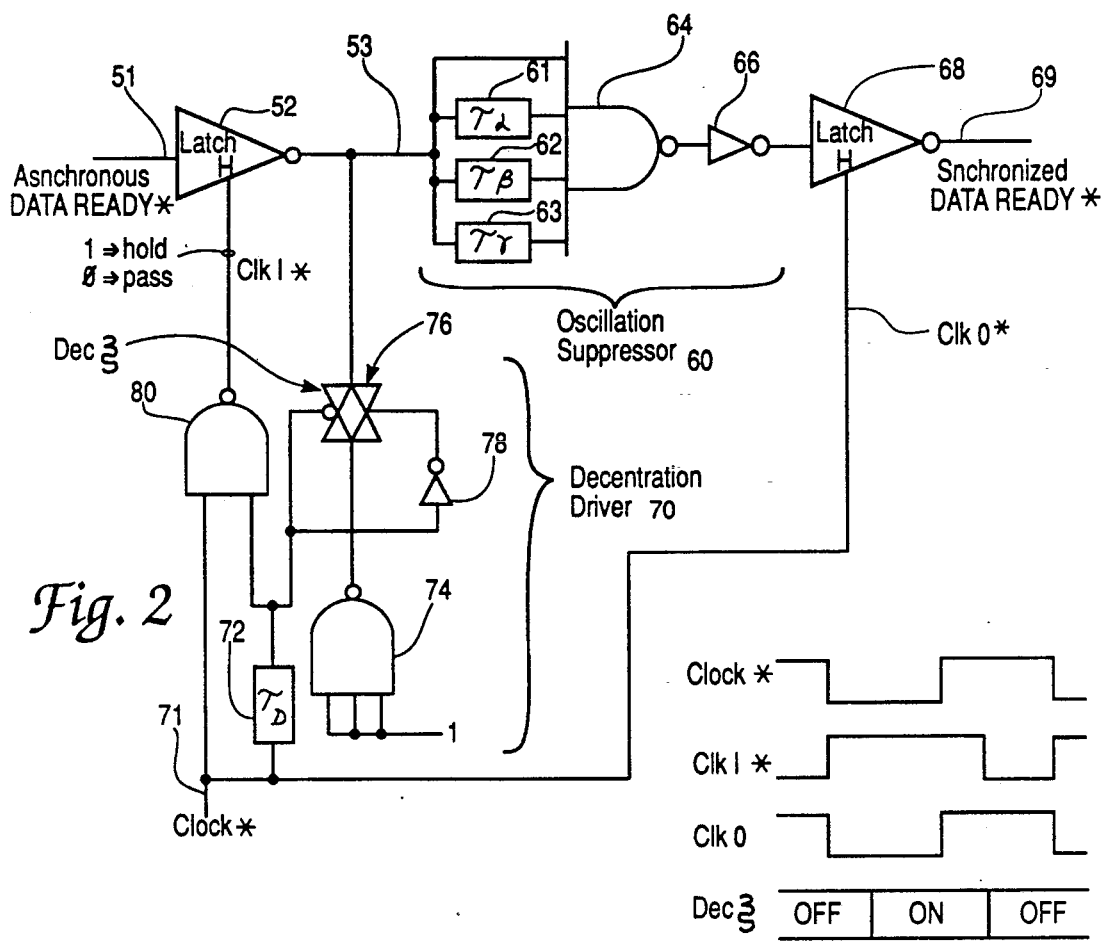
*Fig. 2*
*Fig. 2a*
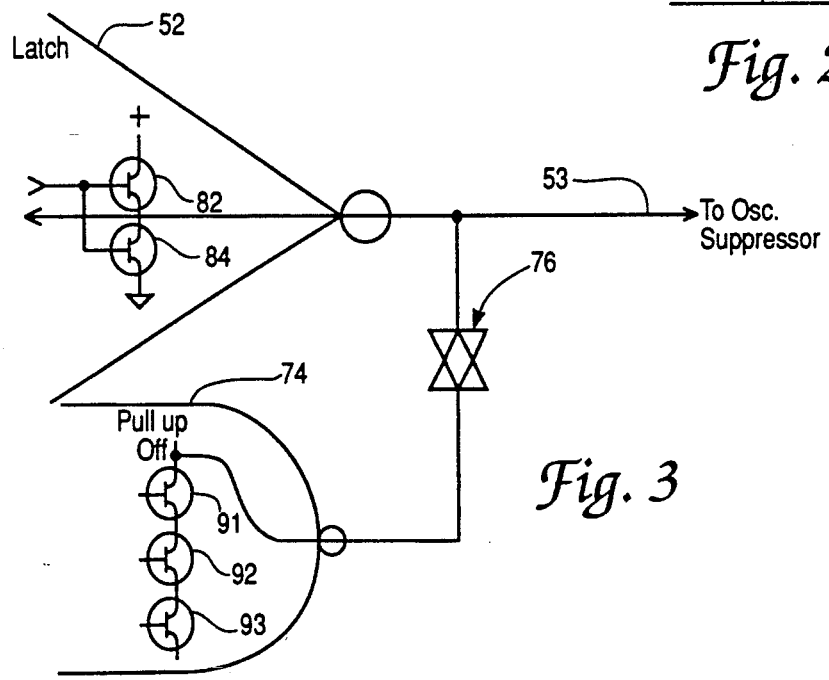
*Fig. 3*

METASTABLE TOLERANT ASYNCHRONOUS INTERFACE

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a metastable tolerant asynchronous interface circuit, and more particularly to a device for passing data from a circuit running at a first clock rate to another circuit running at a second clock rate.

One problem associated with passing data from a circuit running at one clock rate to another circuit running at a different clock rate is that signals from the one circuit to flip-flops in the other circuit will sometimes change at the flip-flop input while the clock is trying to load that flip-flop. When this happens the flip-flop may end up getting a solid logic 0, a solid logic 1, or something in between, called a metastable state. Since the metastable state is not a reliable logic 0 or 1, the circuitry that it drives can become confused and produce spurious outputs.

United States patents of interest include U.S. Pat. No. 4,289,979, to Muller, which teaches a master-slave flip-flop circuit. U.S. Pat. No. 4,495,628 to Zasio also teaches a master-slave latching circuit, having delay testing capability. U.S. Pat. No. 4,698,830 to Barzilai et al teaches a shift register latch circuit having two clocked DC latches. U.S. Pat. No. 4,780,895 to Paul teaches a circuit for stabilizing the pulse output from two counters.

SUMMARY OF THE INVENTION

An objective of the invention is to provide a circuit which suppresses the pernicious effects of metastable states by forcing the flip-flop output to a reliable logic 0 or 1 when it is in a metastable state.

The invention relates to a metastable tolerant asynchronous interface circuit, for passing data from a first unit under the control of a first clock running at one rate to a second unit under the control of a second clock running at another rate. The interface circuit includes an In control circuit and an Out control circuit, with READY leads from the In control circuit to the Out control circuit to signal when a data word has been loaded by the first unit for the second unit; and TAKEN leads from the Out control circuit to the In control circuit to signal when a data word has been received by the second unit.

A feature of the invention is that an Anti-Metastable Flip-flop (AMF) is used with each READY lead and each TAKEN lead. Each AMF flip-flop comprises an input latch, an output latch, a decentration driver, and an oscillation suppressor. The decentration driver handles cases in which the output of the input latch is balanced and floating or balanced and driven by tugging the output of the input latch toward a logic 0 soon after an active edge of a signal on the flip-flop clock lead has caused the input latch to close. The oscillation suppressor is coupled between the input latch and the output latch for eliminating oscillation by delaying output signals from the input latch by various times and anding the differently delayed signals together. Thus the interface circuit suppresses the effects of metastable states by forcing the flip-flop output to a reliable logic 0 or 1 when it is in a metastable state.

The circuit disclosed herein is unique in that it suppresses states in asynchronous interfaces without inserting additional flip-flop delays, or requiring retransmission of data.

BRIEF DESCRIPTION OF THE DRAWING

FIG. 2 is a functional block diagram of an anti-metastable flip-flop used in the circuit of FIG. 1;

FIG. 2a is a timing diagram for FIG. 2; and

FIG. 3 is a diagram showing decentration driver resistive detail.

DETAILED DESCRIPTION

Background

Figure 1:
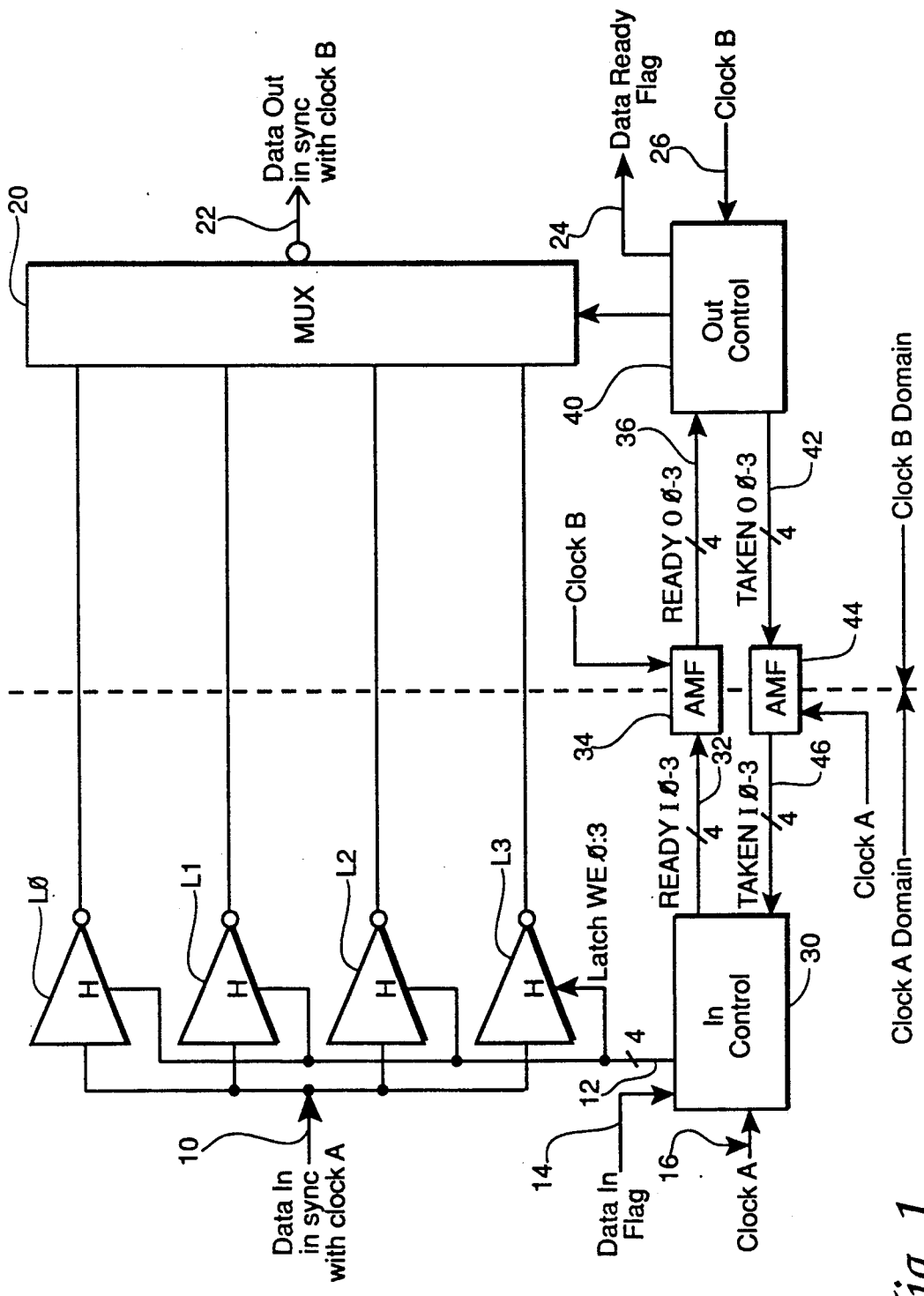
FIG. 1 is a block diagram showing an asynchronous data interface circuit.

When one circuit running at some clock rate (call it A) has to communicate with another circuit running at another clock rate (call it B), it has to send signals that are in sync with clock A to flip-flops that are loaded by clock B. In FIG. 1, a dashed line down the center divides the circuit A at the left indicated as the clock A domain, from the circuit B at the right indicated as the clock B domain.

In the Asynchronous Data Interface shown in FIG. 1, data words enter at the left on line 10 in sync with clock A and exit on the right on line 22 in sync with clock B. The four latches L0-L3 and the multiplex unit (mux) 20 form a FIFO (first in first out buffer). (Note that each of the latch symbols L0-L3 represents a unit for storing a plurality of bits forming a word in parallel, and that the lines 10 and 22 have parallel conductors for complete data words.) As the data words come in, an In Control unit 30 loads them successively into latches L0, L1, L2, L3, using write enable signals on four conductors of a line 12 to the respective latches, and then starts over at L0. Input signals to the In control unit 30 include a data in Flag signal on line 14 and the clock A signals on line 16. An Out Control unit 40 switches the mux unit 20 in sync with clock B to successively read out the words in the latch file. The Out control unit 40 receives the clock B signals on line 26 and supplies a data ready flag signal on line 24.

The following description uses an asterisk, *, to denote a logic signal that is true when its voltage level is low.

Since loading the latches L0-L3 is a synchronous operation entirely under the control of circuit A, and reading the latches is a similarly synchronous operation entirely under the control of circuit B, the problem of transferring data reliably across the asynchronous interface reduces to providing a way for circuit A to reliably tell circuit B which latches have data words ready, and to provide a similar way for circuit B to tell circuit A which latches have been emptied. The clock A circuitry (In control unit 30) employs READY0*, READY1*, READY2*, and READY3* signals on a four-conductor line 32 to tell the clock B circuitry (Out control unit 40) which latches are loaded, while the clock B circuitry uses TAKEN0*, TAKEN1*, TAKEN2*, and TAKEN3* on a four-conductor line 42 to tell the clock A circuitry what latches it has emptied.

When circuit A loads latch L0 it switches READY0* from 1 to 0. If circuit A were to send this signal directly to a flip-flop in circuit B the 1 to 0 transition could occur before the active edge of clock B that loads the flip-flop, or after the active edge of clock B, or at the same time.

If the 1 to 0 transition occurs before the active edge of clock B, then the clock B flip-flop will switch reliably to 0 after the clock edge.

If the 1 to 0 transition occurs after the active edge of clock B, then the clock B flip-flop will remain reliably in the 1 state, and switch reliably to 0 when the next active edge of clock B occurs.

If the 1 to 0 transition occurs at the same time as the active edge of clock B, then the flip-flop can do one of three things. It can:

Float at an intermediate state between 0 and 1 with both the pull up and pull down drivers off. This is the balanced undriven state.

Remain at an intermediate state between 0 and 1 with both the pull up and pull down drivers on and pulling equally in opposite directions. This is the balanced driven state.

Oscillate. In this case the two-inverter loop forming the output latch of the flip-flop switches rapidly between logic 0 and logic 1. How fast depends on the logic used, but it will be much faster than the clock rate, and can confuse the B clock circuitry just as thoroughly as either of the preceding states.

Prior art used two or three flip-flops in succession to block the propagation of the metastable states, or passed checksums along with the data and retransmitted the data if there were errors in it. Both techniques introduce delays that this invention avoids.

The Invention

The circuit is shown implemented in CMOS CGA (Complementary Metal Oxide Semiconductor - Configurable Gate Array). It could also be implemented in other technologies. A new feature is the use of Anti-Metastable Flip-flops (AMFs) for coupling the control signals in each direction between the In control unit 30 and the Out control unit 40 of FIG. 1.

The READY signals from the In control unit 30 of the clock A circuitry pass to the Out control unit 40 of the clock B circuitry through a set of four AMFs 34 that are clocked in sync with clock B. There is a similar set of four AMFs 44 running on clock A that carry the TAKEN signals back from the Out control unit 40 of the clock B circuitry to the In control unit 30 of the clock A circuitry. (In FIG. 1, the set of four leads 32 from the In control unit 30 to the AMFs 34 are designated READYI0-4, and a set of four leads 36 from the AMFs 34 to the Out control unit 40 are designated READYO0-4. The set of four leads 42 from the Out control unit 40 to the AMFs 44 are designated TAKENO0-4, and a set of four leads 46 from the AMFs 44 to the In control unit 30 are designated TAKENI0-4.)

Metastable states still occur within these flip-flops, but special circuitry in the AMFs suppress these states so they don't affect the outputs of the AMFs. An unavoidable side effect of this extra circuitry is that the clock to output propagation delay is longer than for a normal flip-flop.

The Anti-Metastable Flip-flop diagram of FIG. 2 shows the asynchronous DATAREADY- signal on lead 51 entering an input latch 52 of the flip-flop, a decentration driver 70, an oscillation suppressor 60, and an output latch 68 of the flip-flop, whose output is the synchronized DATAREADY-signal on line 69.

The timing diagram of FIG. 2a shows that the clock signal on lead ClkI* to the input latch 52 overlaps the clock signal on lead ClkO* to the output latch 68 to eliminate races between the input and output latches. It also shows that the decentration driver 70 (Dec3S) is on for about $\frac{1}{2}$ clock starting soon after the active edge of the Clock* signal on lead 71.

The falling edge of the Clock* signal is the active clock edge. When it falls it traps the state of the READY* signal by closing the input latch 52. If the READY- signal was stable at the falling edge of the Clock* signal then the output of the input latch on line 53 will be a stable 0 or 1. If the READY* signal was changing when the Clock* signal fell, then the output of the input latch 52 can be balanced and floating, balanced and driven, or oscillating.

Decentration Driver

The decentration driver 70 handles the two balanced cases by tugging the output of the input latch 52 toward logic 0 soon after the edge of the Clock* signal has closed the input latch 52. This tug unbalances the latch 52 and leaves it at a stable 0.

The decentration driver 70 comprises a transmission gate 76, a NAND gate 74, and an inverter 78. The Clock * signal on line 71 is coupled via a time delay device 72 directly to the inverting control input, and via the inverter 78 to the other control input of the gate 76. A NAND gate 80 has inputs from the clock lead 71 and the dealy device 72, and its output provides the clock signal ClkI- to the input latch 52. The clock lead 71 is connected directly to the clock input of the output latch 68 to provide the clock signal ClkO. The NAND gate 74 is shown as having three inputs which are connected to provide a logic 1, and its output is connected to the transmission input of the gate 76, to provide a logic 0.

The decentration driver is a tri-state driver that is off (high-Z) during the time the input latch 52 is getting loaded with a new value, and then turns on and tries to pull the output toward ground (logic 0) after the latch is closed and has had a chance to stabilize. The unit 72 provides a time delay $\tau_D$ to control how long after input latch closure the driver turns on, and incidentally stretches the clock signal ClkI* to overlap the clock signal ClkO, as shown in FIG. 2a.

The strength of the decentration driver 70 is controlled by the number of inputs on the NAND gate 74 which drives the transmission gate 76 (fewer inputs = stronger driver), and should be made as strong as possible without risking hauling a stable logic 1 state down to logic 0. The Decentration Driver Resistive Details of FIG. 3 shows the relative strengths of drivers involved for a CMOS circuit assuming the driver 70 uses a 3-input NAND gate 74. If the active edge of the Clock* signal traps a stable logic 1 in the input latch 52, the pull-up transistor 83 will be on. When the decentration-driver transmission gate 70 turns on the NAND gate 74 will attempt to pull down the latch 52 output on lead 53 with three transistors 91–93 in series, which should be only enough to pull the logic output one quarter of the way to logic 0, if both the p and n transistors have the same resistances. The exact implementation of the decentration driver depends on the technology used.

Oscillation Suppressor

The oscillation suppressor shown in FIG. 2 comprises a NAND gate 64 followed by an inverter 66 to provide an AND function. One of the four inputs of the gate 64 is connected directly to the lead 53; while the other three inputs are coupled to lead 53 via delay units 61, 62 and 63, which provide time delays $\tau_\alpha$, $\tau_{62}$, and $\tau_\gamma$ respectively.

The decentration driver 70 takes care of the two balanced states, but cannot correct oscillation because the latch 52 strongly drives the signal to 0 and 1. The oscillation suppressor 60 eliminates oscillation by delaying the latch output signal on lead 53 by various times ($\tau_\alpha$, $\tau_\beta$, and $\tau_\gamma$ in this example) and anding the differently delayed signals together. The anding operation forces the net signal to 0 whenever any of the delayed signals is 0. The difference between the rising and falling prop delays of the NAND gate 68 also reinforces this conversion of alternating 0s and 1s to an effectively steady 0.

Given enough delays of enough different lengths, the oscillation suppressor 60 can kill any oscillation above the minimum frequency that the two-inverter loop in the latch 52 can support. How many delays to use, how long they should be, and what to build them from depend on the technology used. In an embodiment that was implemented, a string of logic inverters was used.

Side Effect

An unavoidable side effect of the oscillation suppressor 60 is that it increases the effective clock to output propagation delay of the AMF compared to a normal flip-flop.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. An Anti-Metastable Flip-flop (AMF) comprising an input latch and an output latch, each said latch having a data input, a clock input and an output, the data input of the input latch being coupled to an asynchronous control line of one control circuit, the output of the output latch being coupled to a synchronized control line of an other control circuit, a flip-flop clock lead coupled from a source of clock pulses for said other control circuit to the clock input of the output latch;

a decentration driver comprising a transmission gate having an input, an output, and control means for operating the transmission gate between a high impedance off state and a low impedance on state, a logic gate having a plurality of inputs connected together at one logic level and an output coupled to the input of the transmission gate, with the output of the transmission gate coupled to the output of the input latch, a delay device connected from said flip-flop clock lead to said control means of the transmission gate;

an input clock gate having inputs connected respectively to said flip-flop clock lead and said delay device and an output coupled to the clock input of the input latch, to thereby stretch clock signals to the input latch to overlap clock signals to the output latch;

whereby the decentration driver handles cases in which the output of the input latch is balanced and floating or balanced and driven by tugging the output of the input latch toward a given logic state soon after an active edge of a signal on the flip-flop clock lead has caused the input latch to close;

an oscillation suppressor comprising AND gate means and a plurality of delay means for eliminating oscillation by delaying output signals from the input latch by various times and anding the differently delayed signals together, said delay means being connected from the output of the input latch to separate inputs of the AND gate means, and an output of the AND gate means being coupled to the data input of the output latch.

2. An Anti-Metastable Flip-flop (AMF) according to claim 1, wherein said input latch and said output latch are CMOS circuits;

wherein said transmission gate of the decentration driver is a CMOS device, said control means for operating the transmission gate comprises a direct connection from said delay device to an inverting control terminal and a CMOS logic inverter coupled between the delay device and an inverting control terminal of the transmission gate, wherein said logic gate is a CMOS NAND gate having the inputs connected to a "1" logic level;

wherein said input clock gate is a CMOS NAND gate; and wherein said AND gate means of the oscillation suppressor is a CMOS NAND gate followed by a CMOS logic inverter, with the last said NAND gate having one input connected directly to the output of the input latch.

3. A metastable tolerant asynchronous interface circuit, for passing data from a first unit under the control of a first clock running at a first clock rate to a second unit under the control of a second clock running at a second clock rate;

wherein said interface circuit includes an In control circuit and an Out control circuit;

a set of N READY leads from the In control circuit, a first AMF unit comprising N AMF devices (Anti-Metastable Flip-flops) having flip-flop clock inputs from the second clock, with each AMF device of the first AMF unit having an input from one of said READY leads and an output to the Out control circuit;

a set of N TAKEN leads from the Out control circuit, a second AMF unit comprising N AMF devices having flip-flop clock inputs from the first clock, with each AMF device having an input from one of said TAKEN leads and an output to the In control circuit;

wherein each AMF device of each AMF unit comprises an input latch, an output latch, a decentration driver, an input clock gate, and an oscillation suppressor;

wherein each input latch and output latch of each AMF device has a data input, a clock input and an output, the data input of the input latch being coupled to an asynchronous control line which is one of said READY lines for AMF devices of the first AMF unit and one of said TAKEN lines for AMF devices of the second AMF unit, the output of the output latch being coupled to a synchronized control line which goes to the Out control circuit for AMF devices of the first AMF unit and to the In control circuit for AMF devices of the second AMF unit;

wherein the decentration driver comprises means for handling cases in which the output of the input latch is balanced and floating or balanced and driven by tugging the output of the input latch toward a given logic state soon after an active edge of a signal on the flip-flop clock lead has caused the input latch to close;

wherein the oscillation suppressor of each AMF device comprises means coupled between the output of the input latch and the data input of the output latch for eliminating oscillation by delaying output signals from the input latch by various times and anding the differently delayed signals together;

whereby the interface circuit suppresses the effects of metastable states by forcing the flip-flop output to a reliable logic 0 or 1 when it is in a metastable state.

4. A CMOS metastable tolerant asynchronous interface circuit, for passing data from a first unit under the control of a first clock running at a first clock rate to a second unit under the control of a second clock running at a second clock rate;

wherein said interface circuit comprises N latch units having data inputs with sync signals from the first clock and also having latch inputs, an In control circuit, the latch inputs to the latch units being coupled to receive clock signals from the In control circuit, said In control circuit receiving signals on two inputs in turn, namely a data in Flag signal and a first clock sync signal from the first clock;

wherein outputs from said latch units are coupled to a multiplexer from which output data for the second unit in sync with the second clock is obtained;

an Out control circuit having an input from the second clock, an output to the multiplexer, and an output ready Flag signal lead to exterior circuits of the second unit;

a set of N READY leads from the In control circuit, a first AMF unit comprising N AMF devices (Anti-Metastable Flip-flops) having flip-flop clock inputs from the second clock, with each AMF device of the first AMF unit having an input from one of said READY leads and an output to the Out control circuit;

a set of N TAKEN leads from the Out control circuit, a second AMF unit comprising N AMF devices having flip-flop clock inputs from the first clock, with each AMF device having an input from one of said TAKEN leads and an output to the In control circuit;

in operation, as data words come in from the first unit, the In control circuit loads them successively into latch units from the first to the Nth and then starting over at the first in sync with the first clock, while the Out control circuit switches the multiplexer in sync with the second clock to successively readout the words in the latch file, with the In control circuit signalling the Out control circuit via the READY leads which latch units have been emptied, and the Out control circuit signalling the In control circuit via the TAKEN leads which data words have been received;

wherein each AMF device of each AMF unit comprises an input latch, an output latch, a decentration driver, an input clock gate, and an oscillation suppressor;

wherein each input latch and output latch of each AMF device has a data input, a clock input and an output, the data input of the input latch being coupled to an asynchronous control line which is one of said READY lines for AMF devices of the first AMF unit and one of said TAKEN lines for AMF devices of the second AMF unit, the output of the output latch being coupled to a synchronized control line which goes to the Out control circuit for AMF devices of the first AMF unit and to the In control circuit for AMF devices of the second AMF unit;

wherein the decentration driver of each AMF device comprises a transmission gate having an input, an output, and control means for operating the transmission gate between a high impedance off state and a low impedance on state, a logic gate having a plurality of inputs connected together at one logic level and an output coupled to the input of the transmission gate, with the output of the transmission gate coupled to the output of the input latch, a delay device connected from said flip-flop clock lead to said control means of the transmission gate;

wherein the input clock gate of each AMF device has inputs connected respectively to said flip-flop clock lead and said delay device and an output coupled to the clock input of the input latch, to thereby stretch clock signals to the input latch to overlap clock signals to the output latch;

whereby the decentration driver handles cases in which the output of the input latch is balanced and floating or balanced and driven by tugging the output of the input latch toward a given logic state soon after an active edge of a signal on the flip-flop clock lead has caused the input latch to close;

wherein the oscillation suppressor of each AMF device comprises AND gate means and a plurality of delay means for eliminating oscillation by delaying output signals from the input latch by various times and anding the differently delayed signals together, said delay means being connected from the output of the input latch to separate inputs of the AND gate means, and an output of the AND gate means being coupled to the data input of the output latch;

whereby the interface circuit suppresses the effects of metastable states by forcing the flip-flop output to a reliable logic 0 or 1 when it is in a metastable state.

* * * * *

UNITED STATES PATENT AND TRADEMARK OFFICE
CERTIFICATE OF CORRECTION

PATENT NO. : 5,045,801
DATED : September 3, 1991
INVENTOR(S) : David L. Mowery

It is certified that error appears in the above-identified patent and that said Letters Patent is hereby corrected as shown below:

Col 5, line 3, "$\tau_{62}$" should read --$\tau_\beta$--.

Signed and Sealed this

Fourth Day of May, 1993

Attest:

MICHAEL K. KIRK

*Attesting Officer*　　　*Acting Commissioner of Patents and Trademarks*